(12) United States Patent
Ha

(10) Patent No.: US 9,099,451 B2
(45) Date of Patent: Aug. 4, 2015

(54) POWER MODULE PACKAGE AND METHOD OF MANUFACTURING THE SAME

(71) Applicant: SAMSUNG ELECTRO-MECHANICS CO., LTD., Suwon-Si (KR)

(72) Inventor: Job Ha, Suwon-Si (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/275,565

(22) Filed: May 12, 2014

(65) Prior Publication Data

US 2015/0144991 A1    May 28, 2015

(30) Foreign Application Priority Data

Nov. 25, 2013    (KR) .................. 10-2013-0143963

(51) Int. Cl.
| | | |
|---|---|---|
| *H01L 23/495* | (2006.01) | |
| *H01L 21/50* | (2006.01) | |
| *H01L 21/48* | (2006.01) | |
| *H01L 23/373* | (2006.01) | |

(52) U.S. Cl.
CPC ........ *H01L 23/49503* (2013.01); *H01L 23/373* (2013.01); *H01L 23/49562* (2013.01)

(58) Field of Classification Search
CPC .................. H01L 23/49503; H01L 23/49562
USPC .......................... 257/666, 676; 438/123, 124
See application file for complete search history.

(56) References Cited

U.S. PATENT DOCUMENTS

| | | | | |
|---|---|---|---|---|
| 5,216,283 A | * | 6/1993 | Lin ............................... | 257/787 |
| 6,058,602 A | * | 5/2000 | Fehr ............................. | 29/827 |
| 7,714,455 B2 | * | 5/2010 | Son et al. ..................... | 257/787 |

FOREIGN PATENT DOCUMENTS

JP        2001-244292        9/2001

* cited by examiner

*Primary Examiner* — Luan C Thai
(74) *Attorney, Agent, or Firm* — Ladas & Parry, LLP

(57) ABSTRACT

Disclosed herein are a power module package and a method of manufacturing the same. The power module package includes first and second semiconductor devices mounted on sides of first and second lead frames, ends of which are separated from each other, respectively, a support pin corresponding to a mounting position of the first semiconductor device and formed adjacent to a lower portion of the first lead frame, and a molding portion formed to cover portions of the first and second lead frames and the first and second semiconductor devices.

16 Claims, 6 Drawing Sheets

POWER MODULE PACKAGE AND METHOD OF MANUFACTURING THE SAME

CROSS REFERENCE TO RELATED APPLICATION

This application claims the benefit of Korean Patent Application No. 10-2013-0143963, filed on Nov. 25, 2013, entitled "Power Module Package and Method of Manufacturing for the Same", which is hereby incorporated by reference in its entirety into this application.

BACKGROUND OF THE INVENTION

1. Technical Field

The present invention relates to a power module package and a method of manufacturing the same.

2. Description of the Related Art

Along with energy efficiency regulation, power conversion and energy efficiency have increasingly attracted attention. With regard to a power semiconductor module, users' requirements for miniaturization, high heat dissipation, high reliability, etc. as well as for maximized power conversion efficiency have grown strength. In order to satisfy these various requirements, there is a need to ensure power semiconductor components with stable characteristics and to also develop power semiconductor module with a new structure considered together with electrical connection, heat dissipation design, structure design, etc.

PRIOR ART DOCUMENT (Patent Document 1) Japanese Patent Laid-Open Publication 2001-244292

SUMMARY OF THE INVENTION

The present invention has been made in an effort to provide a power module package and a method of manufacturing the same, in which a support pin is formed below a lead frame on which a heating device is mounted, thereby preventing the lead frame from drooping and achieving enhanced heat dissipation characteristics.

According to an embodiment of the present invention, there is provided a power module package including first and second semiconductor devices mounted on sides of first and second lead frames, ends of which are separated from each other, respectively, a support pin corresponding to a mounting position of the first semiconductor device and formed adjacent to a lower portion of the first lead frame, and a molding portion formed to cover portions of the first and second lead frames and the first and second semiconductor devices.

Each of the first and second lead frames may have one side and the other side, and one side is disposed in the molding portion and the other side is protruded from the molding portion.

The power module package may further include a substrate formed to be spaced apart from the first lead frame so as to embed a portion of the support pin below the first lead frame.

The support pin may be filled with sol-gel or an insulating material containing a boron nitride (BN) filler.

The first semiconductor device may be a heating device.

The first semiconductor device may be an insulated gate bipolar transistor (IGBT).

The power module package may further include a wire for electrically connecting the first and second semiconductor devices.

According to another embodiment of the present invention, there is provided a method of manufacturing a power module package, including: mounting first and second semiconductor devices on sides of first and second lead frames, ends of which are separated from each other, respectively, forming a molding portion to cover the first and second lead frame and the first and second semiconductor device, forming a support pin corresponding to a mounting position of the first semiconductor device to contact a lower portion of the first lead frame, and forming the other side of each of the first and second lead frames.

The forming of the molding portion may include forming a metallic mold having a protrusion portion for inserting the support pin, injecting a molding material in the metallic mold, and removing the metallic mold.

The forming of the molding portion may include forming one side of the first and second lead frames in the molding portion and forming other side of the first and second lead frame to be protruded from the molding portion.

The method may further include forming a substrate to be spaced apart from the first lead frame so as to embed a portion of the support pin below the first lead frame after the mounting of the first semiconductor device on one side of the first lead frame.

The substrate may include an opening for inserting the support pin.

The method may further include filling the support pin with sol-gel or an insulating material containing a boron nitride (BN) filler.

The first semiconductor device may be a heating device.

The first semiconductor device may be an insulated gate bipolar transistor (IGBT).

The method may further include forming a wire for electrically connecting the first and second semiconductor devices after the mounting of the first and second semiconductor devices.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
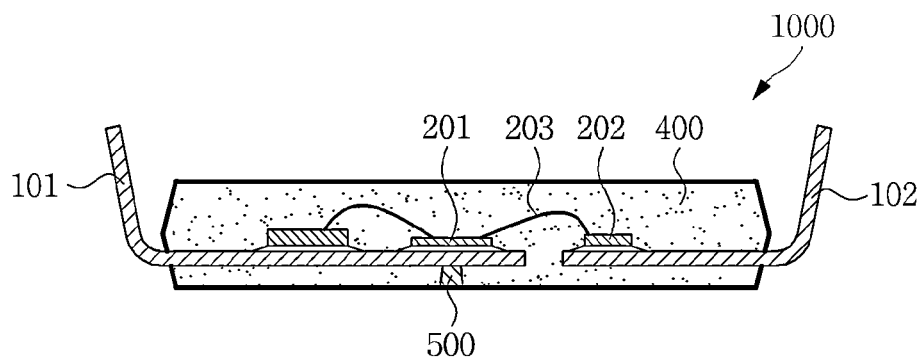
FIG. 1 is a cross-sectional view of a power module package according to a first embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Power Module Package

FIG. 1 is a cross-sectional view of a power module package 1000 according to a first embodiment of the present invention.

As illustrated in FIG. 1, the power module package 1000 according to the first embodiment of the present invention includes first and second semiconductor devices 201 and 202 that are mounted on sides of first and second lead frames 101 and 102, ends of which are separated from each other, respectively, a support pin 500 corresponding to a mounting position of the first semiconductor device 201 and formed adjacent to a lower portion of the first lead frame 101, and a molding portion 400 formed to cover portions of the first and second lead frames 101 and 102 and the first and second semiconductor devices 201 and 202.

Here, each of the first lead frame 101 and the second lead frame 102 may have one side and the other side. One side may define the first and second lead frames 101 and 102 formed in the molding portion 400 and the other side may define the first and second lead frames 101 and 102 protruding out of the molding portion 400.

Thus, the first semiconductor device 201 formed at one side of the first lead frame 101 may be disposed in the molding portion 400.

Here, the first semiconductor device 201 may be a power device and may be an insulated gate bipolar transistor (IGBT) and may include a device with a large heating amount, such as a diode, etc. The second semiconductor device 202 may be a device such as an integrated circuit chip (IC).

According to the present embodiment, in FIG. 1, detailed components of the first semiconductor device 201 and the second semiconductor device 202 are omitted and the first semiconductor device 201 and the second semiconductor device 202 are schematically illustrated. However, it would be understood by those of ordinary skill in the art to apply an unlimited semiconductor device with any structure known in the art to a power module package.

In addition, wires 203 may be further formed to electrically connect the first semiconductor device 201 and the second semiconductor device 202. However, needless to say, any electrical connector known in the art may be selected and applied.

In this case, the wires 203 may be formed of, but is not limited to, aluminum (Al), gold (Au), copper (Cu), etc. In general, a wire for applying a high rated voltage to a semiconductor component as a power device may be formed of Al.

Here, the molding portion 400 may be formed of, but is not limited to, silicone gel, epoxy molded compound, etc.

In this case, the support pin 500 may be formed of an insulating material.

According to the present embodiment, the support pin 500 is formed with a cylindrical shape, but is not particularly limited.

Figure 2:
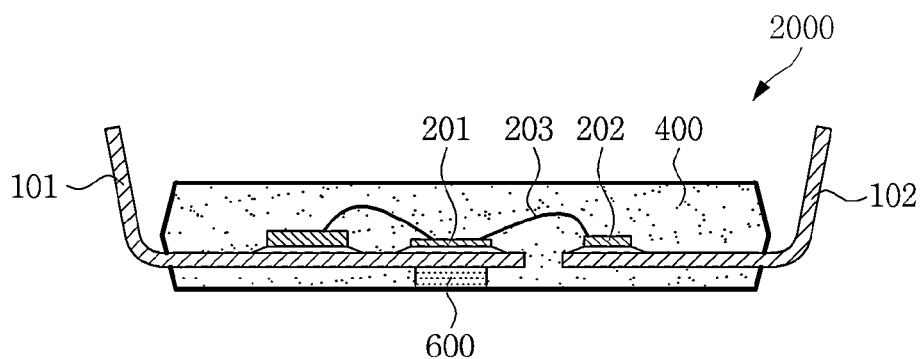
FIG. 2 is a cross-sectional view of a power module package according to a second embodiment of the present invention.

FIG. 2 is a cross-sectional view of a power module package 2000 according to a second embodiment of the present invention.

Prior to description of the second embodiment, a description of the same components as in the first embodiment is omitted and the power module package 2000 will be described in terms of differences from the first embodiment.

As illustrated in FIG. 2, the power module package 2000 according to the second embodiment includes the first and second semiconductor devices 201 and 202 that are mounted on sides of first and second lead frames 101 and 102, ends of which are separated from each other, respectively, a support pin 600 corresponding to a mounting position of the first semiconductor device 201 and formed adjacent to a lower portion of the first lead frame 101, and the molding portion 400 formed to cover portions of the first and second lead frames 101 and 102 and the first and second semiconductor devices 201 and 202.

In this case, the support pin 600 may be formed of, but is not limited to, an insulating material.

Primarily, the support pin 600 may be filled with inexpensive sol-gel so as to prevent absorption failure and to reinforce an anti-absorption structure.

Secondly, the support pin 600 may be filled with an insulating material containing a boron nitride (BN) filler so as to improve a heat dissipate effect of a lower portion of a power semiconductor device that generates a large amount of heat.

In this case, the amount of the filter contained in the insulating material is not particularly limited and may be adjusted according to needs of those of ordinary skill in the art.

According to the present embodiment, the support pin 600 is formed with a cylindrical shape, but is not particularly limited.

In addition, according to the present embodiment, a region of the support pin 600 corresponds to the first semiconductor device 201. However, the present embodiment is not particularly limited. That is, the support pin 600 may be formed to be wider or narrower than an area of the first semiconductor device 201.

Figure 3:
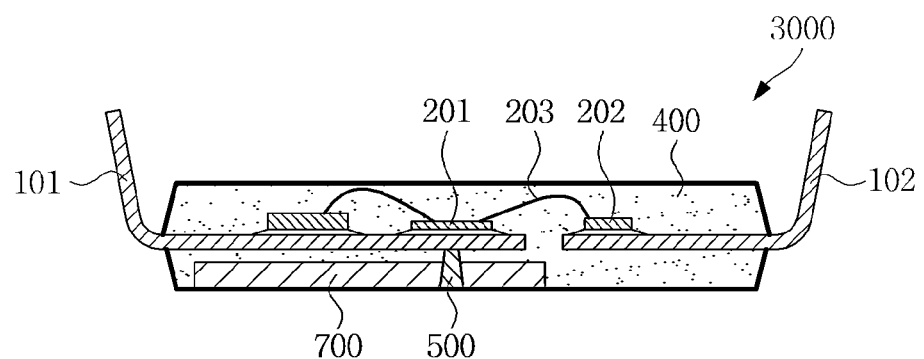
FIG. 3 is a cross-sectional view of a power module package according to a third embodiment of the present invention.

FIG. 3 is a cross-sectional view of a power module package 3000 according to a third embodiment of the present invention.

As illustrated in FIG. 3, the power module package 3000 according to the second embodiment includes the first and second semiconductor devices 201 and 202 that are mounted on sides of first and second lead frames 101 and 102, ends of which are separated from each other, respectively, the support pin 500 corresponding to a mounting position of the first semiconductor device 201 and formed adjacent to a lower portion of the first lead frame 101, and the molding portion 400 formed to cover portions of the first and second lead frames 101 and 102 and the first and second semiconductor devices 201 and 202.

Here, each of the first lead frame 101 and the second lead frame 102 may have one side and the other side. One side may define the first and second lead frames 101 and 102 formed in the molding portion 400 and the other side may define the first and second lead frames 101 and 102 protruding out of the molding portion 400.

Thus, the first semiconductor device 201 formed at one side of the first lead frame 101 may be disposed in the molding portion 400.

Here, the first semiconductor device 201 may be a power device and may be an insulated gate bipolar transistor (IGBT) and may include a device with a large heating amount, such as a diode, etc. The second semiconductor device 202 may be a device such as an integrated circuit chip (IC).

According to the present embodiment, in FIG. 3, detailed components of the first semiconductor device 201 and the second semiconductor device 202 are omitted and the first semiconductor device 201 and the second semiconductor device 202 are schematically illustrated. However, it would be understood by those of ordinary skill in the art to apply an unlimited semiconductor device with any structure known in the art to a power module package.

In addition, wires 203 may be further formed to electrically connect the first semiconductor device 201 and the second semiconductor device 202. However, needless to say, any electrical connector known in the art may be selected and applied.

In this case, the wires 203 may be formed of, but is not limited to, aluminum (Al), gold (Au), copper (Cu), etc. In general, a wire for applying a high rated voltage to a semiconductor component as a power device may be formed of Al.

Here, the molding portion 400 may be formed of, but is not limited to, silicone gel, epoxy molded compound, etc.

In this case, the support pin 500 may be formed of an insulating material.

According to the present embodiment, the support pin 500 is formed with a cylindrical shape, but is not particularly limited.

In addition, a substrate 700 may be further formed to be spaced apart from the first lead frame 101 so as to embed a portion of the support pin 500 below the first lead frame 101.

Here, a portion of the support pin 500 may be formed through the substrate 700.

In addition, lower surfaces of the substrate 700, the support pin 500, and the molding portion 400 may be positioned at the same level.

In this case, the substrate 700 may be a printed circuit board (PCB) or a ceramic substrate, but is not particularly limited.

The PCB is a circuit board including a circuit with one or more layers containing a connection pad and formed on an insulating layer. In FIG. 3, detailed components of an inner circuit are omitted for convenience of description. However, it would be understood by those of ordinary skill in the art to apply a general circuit board.

The ceramic substrate may be formed of metallic nitride or a ceramic material. The metallic nitride may include, for example, aluminum nitride (AlN) or silicon nitride (SiN), and the ceramic material may include, for example, aluminum oxide or beryllium oxide. However, the present embodiment is not particularly limited.

Figure 4:
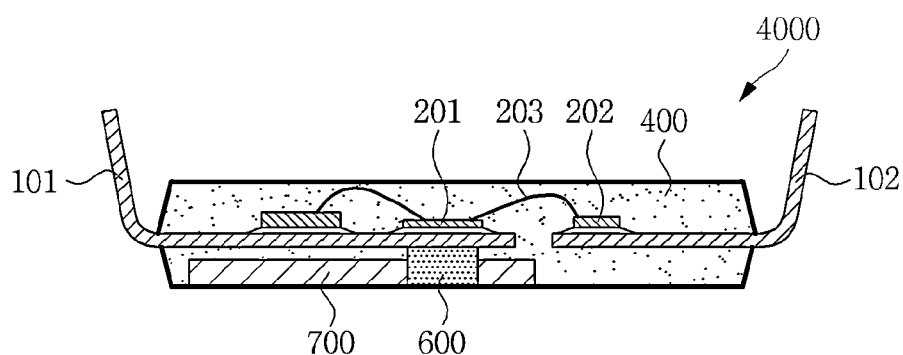
FIG. 4 is a cross-sectional view of a power module package according to a fourth embodiment of the present invention.

FIG. 4 is a cross-sectional view of a power module package 4000 according to a fourth embodiment of the present invention.

Prior to description of the fourth embodiment, a description of the same components as in the third embodiment is omitted and the power module package 4000 will be described in terms of differences from the third embodiment.

As illustrated in FIG. 4, the power module package 4000 according to the fourth embodiment includes the first and second semiconductor devices 201 and 202 that are mounted on sides of first and second lead frames 101 and 102, ends of which are separated from each other, respectively, the support pin 600 corresponding to a mounting position of the first semiconductor device 201 and formed adjacent to a lower portion of the first lead frame 101, and the molding portion 400 formed to cover portions of the first and second lead frames 101 and 102 and the first and second semiconductor devices 201 and 202.

In this case, the support pin 600 may be formed of, but is not limited to, an insulating material.

Primarily, the support pin 600 may be filled with inexpensive sol-gel so as to prevent absorption failure and to reinforce an anti-absorption structure.

Secondly, the support pin 600 may be filled with an insulating material containing a boron nitride (BN) filler so as to improve a heat dissipate effect of a lower portion of a power semiconductor device that generates a large amount of heat.

In this case, the amount of the filter contained in the insulating material is not particularly limited and may be adjusted according to needs of those of ordinary skill in the art.

According to the present embodiment, the support pin 600 is formed with a cylindrical shape, but is not particularly limited.

In addition, according to the present embodiment, a region of the support pin 600 corresponds to the first semiconductor device 201. However, the present embodiment is not particularly limited. That is, the support pin 600 may be formed to be wider or narrower than an area of the first semiconductor device 201.

In addition, the substrate 700 may be further formed to be spaced apart from the first lead frame 101 so as to embed a portion of the support pin 600 below the first lead frame 101.

Here, a portion of the support pin 600 may be formed through the substrate 700.

In addition, lower surfaces of the substrate 700, the support pin 600, and the molding portion 400 may be positioned at the same level.

Power Module Package and Method of Manufacturing the Same

FIGS. 5 to 10 are diagrams illustrating of a method of manufacturing a power module package according to the first embodiment of the present invention.

Figure 5:
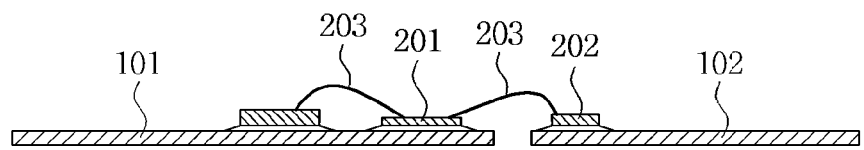
FIGS. 5 to 10 are diagrams illustrating of a method of manufacturing a power module package according to the first embodiment of the present invention.

As illustrated in FIG. 5, the first semiconductor device 201 and the second semiconductor device 202 are mounted on sides of the first lead frame 101 and the second lead frame 102, ends of which are separated from each other, respectively.

Here, adhesive members between the first and second lead frames 101 and 102 and the first and second semiconductor devices 201 and 202 may be formed of, but are not particularly limited to, a solder or conductive epoxy. In general, an adhesive member with high thermal conductivity may be used in order to effectively dissipate heat.

In addition, the wires 203 may be further formed to electrically connect the first semiconductor device 201 and the second semiconductor device 202 that are mounted on sides of first and second lead frames 101 and 102, ends of which are separated from each other, respectively. In this case, the wires 203 may be formed of, but is not limited to, aluminum (Al), gold (Au), copper (Cu), etc. In general, a wire for applying a high rated voltage to a semiconductor component as a power device may be formed of Al.

Although not illustrate, needless to say, a plurality of semiconductor devices may be formed on one side of the first lead frame 101, and the power module package may further include a wire as an electric connector for connecting the plural semiconductor devices.

Figure 6:
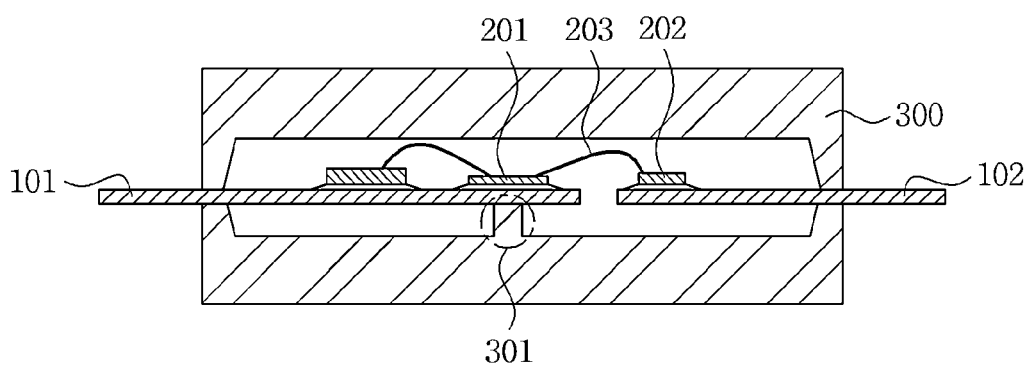

As illustrated in FIG. 6, a metallic mold 300 having a protrusion portion 301 may be mounted. The protrusion portion 301 may be formed to correspond to a position in which a support pin is to be formed.

In addition, the protrusion portion 301 may be formed with a size corresponding to the size of the support pin.

Figure 7:
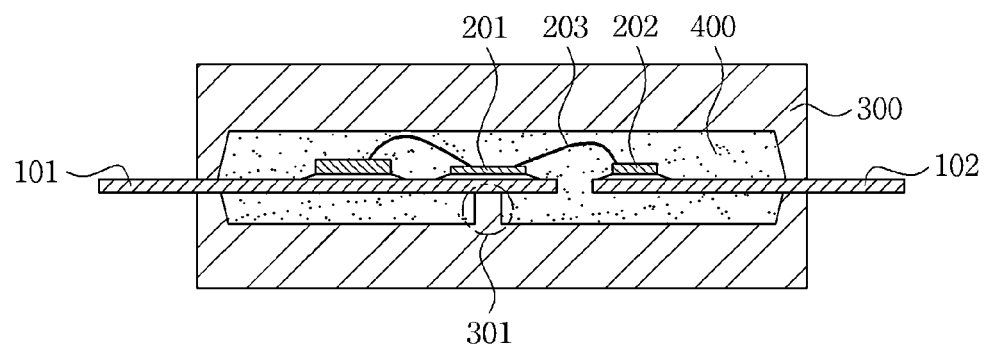

As illustrated in FIG. 7, a molding material may be filled in the metallic mold 300 to form the molding portion 400.

The molding portion 400 may be formed of, but is not limited to, silicone gel, epoxy molded compound, etc.

Figure 8:
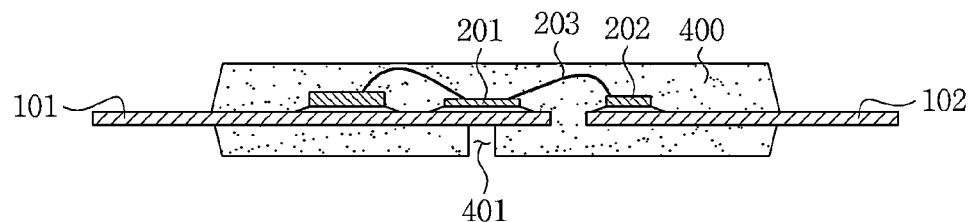

As illustrated in FIG. 8, the metallic mold 300 may be removed to form the molding portion 400 and an opening 401.

Here, the first and second lead frames 101 and 102 formed in the molding portion 400 may be defined as one side, and the first and second lead frames 101 and 102 protruding out of the molding portion 400 may be defined as the other side.

Figure 9:
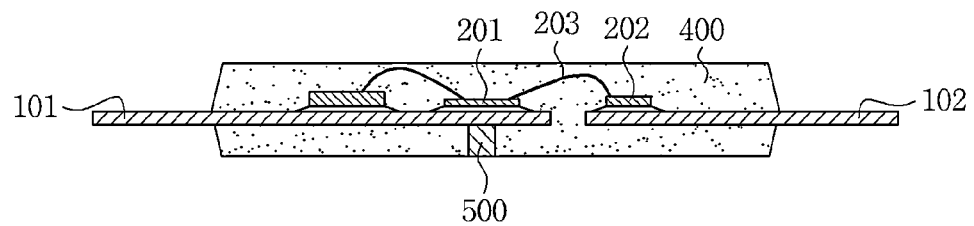

As illustrated in FIG. 9, the support pin 500 may be formed in the opening 401 of the molding portion 400.

In this case, the support pin 500 may be formed of, but is not limited, an insulating material.

Although not illustrated, primarily, the support pin 500 may be filled with inexpensive sol-gel so as to prevent absorption failure and to reinforce an anti-absorption structure.

Secondly, the support pin 500 may be filled with an insulating material containing a boron nitride (BN) filler so as to improve a heat dissipate effect of a lower portion of a power semiconductor device that generates a large amount of heat.

In this case, the amount of the filter contained in the insulating material is not particularly limited and may be adjusted according to needs of those of ordinary skill in the art.

According to the present embodiment, the support pin 500 is formed with a cylindrical shape, but is not particularly limited.

Figure 10:
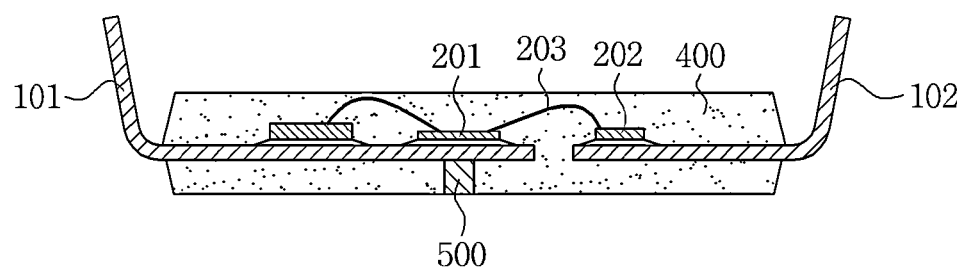

As illustrated in FIG. 10, trim and forming processes may be performed to bend lateral portions of the first lead frame 101 and the second lead frame 102 in one direction.

FIGS. 11 to 16 are diagrams illustrating of a method of manufacturing a power module package according to the fourth embodiment of the present invention.

Figure 11:
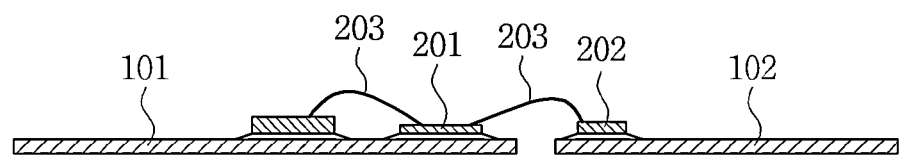
FIGS. 11 to 16 are diagrams illustrating a method of manufacturing a power module package according to other embodiments of the present invention.

As illustrated in FIG. 11, the first semiconductor device 201 and the second semiconductor device 202 are mounted on sides of the first lead frame 101 and the second lead frame 102, ends of which are separated from each other, respectively.

Here, adhesive members between the first and second lead frames 101 and 102 and the first and second semiconductor devices 201 and 202 may be formed of, but are not particularly limited to, a solder or conductive epoxy. In general, an adhesive member with high thermal conductivity may be used in order to effectively dissipate heat.

In addition, the wires 203 may be further formed to electrically connect the first semiconductor device 201 and the second semiconductor device 202 that are mounted on sides of first and second lead frames 101 and 102, ends of which are separated from each other, respectively. In this case, the wires 203 may be formed of, but is not limited to, aluminum (Al), gold (Au), copper (Cu), etc. In general, a wire for applying a high rated voltage to a semiconductor component as a power device may be formed of Al.

Although not illustrate, needless to say, a plurality of semiconductor devices may be formed on one side of the first lead frame 101, and the power module package may further include a wire as an electric connector for connecting the plural semiconductor devices.

Here, the first semiconductor device 201 may be a power device and may be an insulated gate bipolar transistor (IGBT) and may include a device with a large heating amount, such as a diode, etc. The second semiconductor device 202 may be a device such as an integrated circuit chip (IC).

According to the present embodiment, in FIGS. 11 to 16, detailed components of the first semiconductor device 201 and the second semiconductor device 202 are omitted and the first semiconductor device 201 and the second semiconductor device 202 are schematically illustrated. However, it would be understood by those of ordinary skill in the art to apply an unlimited semiconductor device with any structure known in the art to a power module package.

Figure 12:
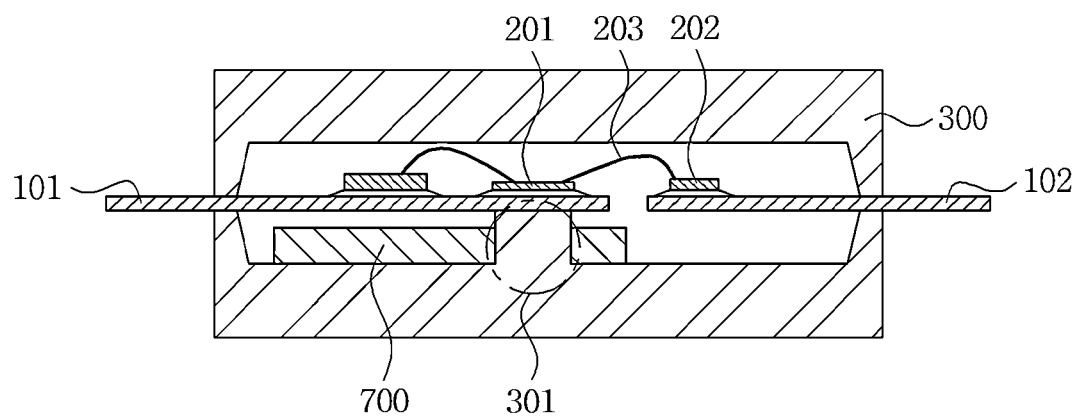

AS illustrated in FIG. 12, the metallic mold 300 having a protrusion portion 301 may be mounted. The protrusion portion 301 may be formed to correspond to a position in which a support pin is to be formed.

In addition, the protrusion portion 301 may be formed with a size corresponding to the size of the support pin.

Here, the substrate 700 may be further formed to be spaced apart from a lower portion of the first lead frame 101. In this case, the protrusion portion 301 of the metallic mold 300 may be formed through the substrate 700 to contact the first lead frame 101.

Here, the substrate 700 may be a printed circuit board (PCB) or a ceramic substrate, but is not particularly limited.

The PCB is a circuit board including a circuit with one or more layers containing a connection pad and formed on an insulating layer. In FIG. 12, detailed components of an inner circuit are omitted for convenience of description. However, it would be understood by those of ordinary skill in the art to apply a general circuit board.

The ceramic substrate may be formed of metallic nitride or a ceramic material. The metallic nitride may include, for example, aluminum nitride (AlN) or silicon nitride (SiN), and the ceramic material may include, for example, aluminum oxide or beryllium oxide. However, the present embodiment is not particularly limited.

Figure 13:
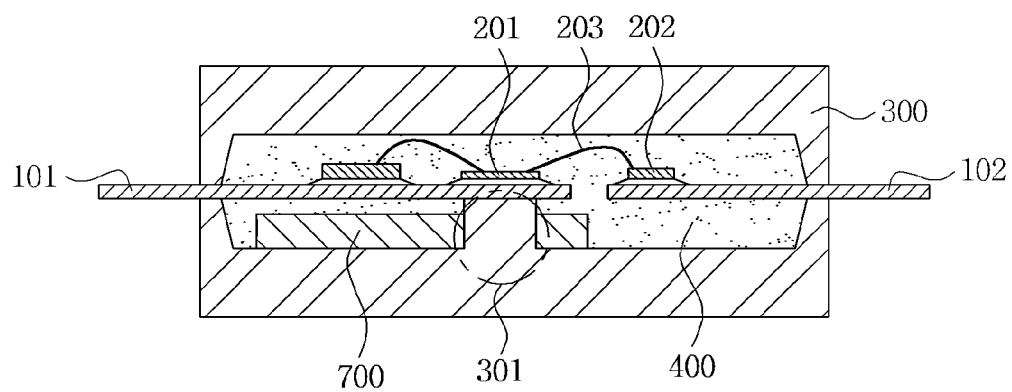

As illustrated in FIG. 13, a molding material may be filled in the metallic mold 300 to form the molding portion 400.

Here, the molding portion 400 may be formed of, but is not limited to, silicone gel, epoxy molded compound, etc.

Figure 14:
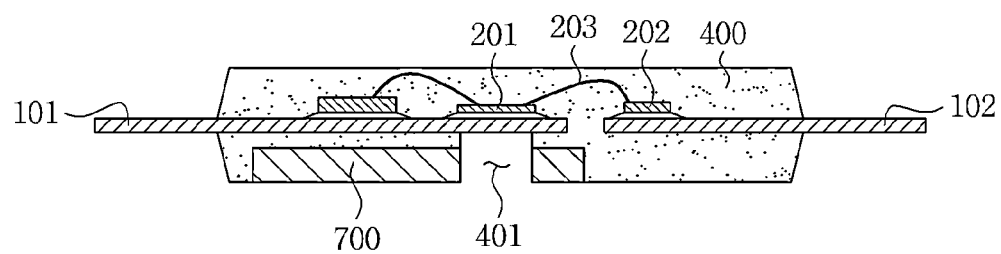

As illustrated in FIG. 14, the metallic mold 300 may be removed to form the molding portion 400 and an opening 401. In this case, the opening 401 is formed through the substrate 700.

Here, the first and second lead frames 101 and 102 formed in the molding portion 400 may be defined as one side, and the first and second lead frames 101 and 102 protruding out of the molding portion 400 may be defined as the other side.

Figure 15:
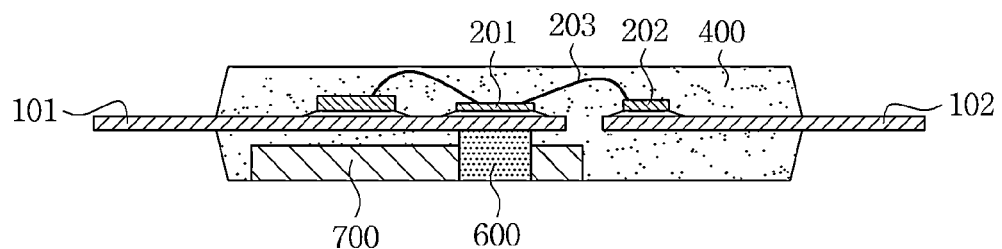

As illustrated in FIG. 15, the support pin 600 may be formed in the opening 401 of the molding portion 400.

In this case, the support pin 600 may be formed of, but is not limited, an insulating material.

Primarily, the support pin 600 may be filled with inexpensive sol-gel so as to prevent absorption failure and to reinforce an anti-absorption structure.

Secondly, the support pin 600 may be filled with an insulating material containing a boron nitride (BN) filler so as to improve a heat dissipate effect of a lower portion of a power semiconductor device that generates a large amount of heat.

In this case, the amount of the filter contained in the insulating material is not particularly limited and may be adjusted according to needs of those of ordinary skill in the art.

According to the present embodiment, the support pin 600 is formed with a cylindrical shape, but is not particularly limited.

In addition, according to the present embodiment, a region of the support pin 600 corresponds to the first semiconductor device 201. However, the present embodiment is not particularly limited. That is, the support pin 600 may be formed to be wider or narrower than an area of the first semiconductor device 201.

Figure 16:
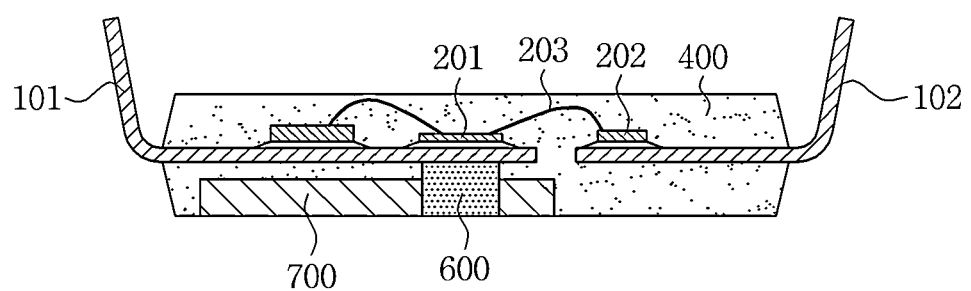

As illustrated in FIG. 16, trim and forming processes may be performed to bend the other side portions of the first lead frame 101 and the second lead frame 102 in one direction. According to the present embodiment, the first and second lead frames 101 and 102 may be bent in an opposite direction to the substrate 700, but the present embodiment is not particularly limited to the direction.

A power module package according to an embodiment of the present invention is configured in such a way that a support pin is formed below a lead frame on which a heating device is mounted, thereby preventing the lead frame from drooping and an insulating material is filled in the support point, thereby achieving enhanced heat dissipation characteristics.

In addition, the height of the support pin may be adjusted to adjust the thickness of the thickness of a portion of the molding portion below the lead frame.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A power module package comprising:
    first and second semiconductor devices mounted on sides of first and second lead frames, ends of which are separated from each other, respectively;
    a support pin corresponding to a mounting position of the first semiconductor device and formed adjacent to a lower portion of the first lead frame; and
    a molding portion formed to cover portions of the first and second lead frames and the first and second semiconductor devices.

2. The power module package as set forth in claim 1, wherein:
    each of the first and second lead frames has one side and the other side, and
    one side is disposed in the molding portion and the other side is protruded from the molding portion.

3. The power module package as set forth in claim 1, further comprising a substrate formed to be spaced apart from the first lead frame so as to embed a portion of the support pin below the first lead frame.

4. The power module package as set forth in claim 1, wherein the support pin is filled with sol-gel or an insulating material containing a boron nitride (BN) filler.

5. The power module package as set forth in claim 1, wherein the first semiconductor device is a heating device.

6. The power module package as set forth in claim 5, wherein the first semiconductor device is an insulated gate bipolar transistor (IGBT).

7. The power module package as set forth in claim 1, further comprising a wire for electrically connecting the first and second semiconductor devices.

8. A method of manufacturing a power module package, the method comprising:
    mounting first and second semiconductor devices on sides of first and second lead frames, ends of which are separated from each other, respectively;
    forming a molding portion to cover the first and second lead frames and the first and second semiconductor devices;
    forming a support pin corresponding to a mounting position of the first semiconductor device to contact a lower portion of the first lead frame; and
    forming the other side of each of the first and second lead frames.

9. The method as set forth in claim 8, wherein the forming of the molding portion includes:
    forming a metallic mold having a protrusion portion for inserting the support pin;
    injecting a molding material in the metallic mold; and
    removing the metallic mold.

10. The method as set forth in claim 8, wherein the forming of the molding portion includes forming one side of the first and second lead frames in the molding portion and forming other side of the first and second lead frame to be protruded from the molding portion.

11. The method as set forth in claim 10, further comprising:
    forming a substrate to be spaced apart from the first lead frame so as to embed a portion of the support pin below the first lead frame after the mounting of the first semiconductor device on one side of the first lead frame.

12. The method as set forth in claim 11, wherein the substrate includes an opening for inserting the support pin.

13. The method as set forth in claim 10, further comprising filling the support pin with sol-gel or an insulating material containing a boron nitride (BN) filler.

14. The method as set forth in claim 10, wherein the first semiconductor device is a heating device.

15. The method as set forth in claim 14, wherein the first semiconductor device is an insulated gate bipolar transistor (IGBT).

16. The method as set forth in claim 10, further comprising:
    forming a wire for electrically connecting the first and second semiconductor devices after the mounting of the first and second semiconductor devices.

* * * * *